(12) United States Patent
Kim et al.

(10) Patent No.: US 10,586,719 B2
(45) Date of Patent: Mar. 10, 2020

(54) SUBSTRATES SUPPORT APPARATUS, SUBSTRATE TREATING SYSTEM INCLUDING THE SAME, AND SUBSTRATE TREATING METHOD

(71) Applicant: SEMES CO., LTD., Cheonan-si, Chungcheongnam-do (KR)

(72) Inventors: Jae-Youl Kim, Gunpo-si (KR); Jong Seok Seo, Cheonan-si (KR); Seongsu Kim, Pyeongtaek-si (KR)

(73) Assignee: SEMES CO., LTD, Cheonan-si, Chungcheongnam-Do (KR)

( * ) Notice: Subject to any disclaimer, the term of this patent is extended or adjusted under 35 U.S.C. 154(b) by 36 days.

(21) Appl. No.: 15/796,318

(22) Filed: Oct. 27, 2017

(65) Prior Publication Data
US 2018/0122660 A1 May 3, 2018

(30) Foreign Application Priority Data
Oct. 31, 2016 (KR) .................. 10-2016-0143142

(51) Int. Cl.
*H01L 21/02* (2006.01)
*H01L 21/67* (2006.01)
(Continued)

(52) U.S. Cl.
CPC .......... *H01L 21/67103* (2013.01); *G03F 1/68* (2013.01); *H01L 21/0273* (2013.01); *H01L 21/02118* (2013.01); *H01L 21/02282* (2013.01); *H01L 21/02318* (2013.01); *H01L 21/6719* (2013.01); *H01L 21/67109* (2013.01); (Continued)

(58) Field of Classification Search
CPC ................................................ H01L 21/67103
See application file for complete search history.

(56) References Cited

U.S. PATENT DOCUMENTS

| | | | | |
|---|---|---|---|---|
| 6,072,163 A | * | 6/2000 | Armstrong | H01L 21/67103 118/724 |
| 2006/0005930 A1 | * | 1/2006 | Ikeda | H01J 37/32431 156/345.51 |
| 2013/0001213 A1 | * | 1/2013 | Lee | H01L 21/67103 219/385 |

FOREIGN PATENT DOCUMENTS

| KR | 10-0512260 B1 | 9/2005 |
|---|---|---|
| KR | 10-2005-0120493 A | 12/2005 |

(Continued)

OTHER PUBLICATIONS

Korean Examination Report dated Feb. 13, 2018, for corresponding Korean Patent Application No. 10-2016-0143142, 11 pages.

*Primary Examiner* — Moazzam Hossain
*Assistant Examiner* — Omar F Mojaddedi
(74) *Attorney, Agent, or Firm* — Procopio, Cory, Hargreaves & Savitch LLP

(57) ABSTRACT

Embodiments of the inventive concept relate to an apparatus for supporting a substrate and a method for treating a substrate. The substrate support apparatus includes a substrate support member including a support plate having an upper surface that supports a substrate, and a heating member provided in the support plate to heat the substrate, wherein an area of the support plate has a buffer area, in which a buffer space for restricting a heat transfer rate of heat provided from the heating member to the upper surface is formed. The buffer space insulates a central area and a peripheral area, thereby maximizing a temperature difference between the central area and the peripheral area.

13 Claims, 11 Drawing Sheets

(51) Int. Cl.
*G03F 1/68* (2012.01)
*H01L 21/027* (2006.01)
*H01L 21/687* (2006.01)

(52) U.S. Cl.
CPC .. *H01L 21/67178* (2013.01); *H01L 21/67248* (2013.01); *H01L 21/68714* (2013.01)

(56) References Cited

FOREIGN PATENT DOCUMENTS

| | | |
|---|---|---|
| KR | 1008487670000 B1 | 7/2008 |
| KR | 10-2011-0083666 A | 7/2011 |
| KR | 1011090800000 B1 | 2/2012 |
| KR | 1014229150000 B1 | 7/2014 |
| KR | 10-2015-0038154 A | 4/2015 |
| KR | 1020160030727 A | 3/2016 |

* cited by examiner

SUBSTRATES SUPPORT APPARATUS, SUBSTRATE TREATING SYSTEM INCLUDING THE SAME, AND SUBSTRATE TREATING METHOD

CROSS-REFERENCE TO RELATED APPLICATIONS

A chain for priority under 35 U.S.C. § 119 is made to Korean Patent Application No. 10-2016-0143142 filed on Oct. 31, 2016, in the Korean Intellectual Property Office, the entire contents of which are hereby incorporated by reference.

BACKGROUND

Embodiments of the inventive concept relate to a substrate treating apparatus and a method for treating a substrate.

Various processes such as cleaning, deposition, photographing, etching, and ion implantation are performed to manufacture a semiconductor device. Among the processes, an application process is used as a process of forming a liquid film on a substrate. In general, an application process is a process of forming a liquid film by applying a treatment liquid onto a substrate.

A baking process of baking a substrate is performed before and after a liquid film is formed on the substrate. The baking process is as process of heating a substrate to a process temperature or higher in a closed space, and stabilizes a liquid film by scattering an organic material on the liquid film. The baking process heats an entire area of the substrate to a uniform temperature and heats areas of the substrate to different temperatures according to the process.

Among them, in the process of heating the areas of the substrate to different temperatures, a thickness of an inside of the substrate with respect to a reference area and a thickness of an outside of the substrate with respect to the reference area are differently adjusted.

FIG. 1 is a sectional view illustrating a general baking apparatus. FIG. 2 is a graph depicting temperatures of areas of a substrate of FIG. 1. Referring to FIGS. 1 and 2, a substrate is seated on an upper surface of a support plate and a heater heats the substrate. A plurality of heaters are provided, and are provided in different areas of the support plate. The heat generated by the heater is conducted to the substrate through the support plate. Inside heaters located in an inner area of the support plate heat the substrate to an inside temperature, and outside heaters located in an outer area of the support plate heat the substrate to different an outside temperature that is different from the inside temperature. However, the temperature of the substrate gradually increases or decreases as it goes from the center to a peripheral area of the substrate. Accordingly, the inside temperature of the liquid film is not uniform, and thus gradually increases or gradually increases and then decreases again as it goes toward the outside.

The uneven inside thickness of the liquid film may cause process inferiority. Accordingly, an apparatus and a method for making the inside thickness and the outside thickness of the liquid film different but making the inside thickness of the liquid film uniform.

PRIOR TECHNICAL DOCUMENTS

Patent Documents

Korean Patent Application Publication Document 2002-0020847

SUMMARY

Embodiments of the inventive concept provide an apparatus and a method for making an inside thickness and an outside thickness of a liquid film formed on a substrate different and forming a uniform inside thickness.

Embodiments of the inventive concept provide an apparatus and a method for supporting a substrate. In accordance with an aspect of the inventive concept, there is provided a substrate support apparatus including a substrate support member including a support plate having an upper surface that supports a substrate, and a heating member provided in the support plate to heat the substrate, wherein an area of the support plate has a buffer area, in which a buffer space for restricting a heat transfer rate of heat provided from the heating member to the upper surface is formed.

The heating member may heat a plurality of areas of the support plate to different temperatures, and when viewed from the top, the buffer area and the heating member may not be located not to overlap each other. The heating member may include a first heater configured to heat a first area of the support plate to a first temperature, and a second heater configured to heat a second area of the support plate to a second temperature that is different from the first temperature, and when viewed from the top, the buffer area may be located between the first area and the second area. The first area may include a central area of the support plate, the second area may include a peripheral area of the support plate, and when viewed from the top, the buffer area may be provided to surround a circumference of the first area.

The buffer space may include an inside space provided to surround the circumference of the first area, and an outside space that is independent from the inside space and provided to surround a circumference of the inside space. The outside space may have a depth that is larger than that of the inside space.

A vertical section of the buffer area may have a circular shape of the buffer space.

A depth of the buffer space may be constant.

A depth of the buffer space may become larger as it goes away from a center of the support plate.

A difference value between a thickness (L1) connecting an upper surface and a bottom surface of the support plate and a depth (L2) of the buffer space may be 1.5 mm or less.

In accordance with another aspect of the inventive concept, there is provided a method for treating a substrate, the method including heating the substrate on a support plate, and heating the substrate by using a conduction heat through the support plate, by a heating member installed in the support plate, wherein the support plate has a buffer area having a buffer space for restricting a heat transfer rate of the conduction heat such that a temperature gradient is generated between a plurality of areas of the substrate.

The heating member may heat a central area of the substrate to a first temperature and may heat a peripheral area of the substrate to a second temperature that is different from the first temperature. The substrate may have a temperature gradient area located between the central area and the peripheral area to surround the central area, and when viewed from the top, the buffer space may be located to overlap the temperature gradient area. The substrate may be a substrate having a liquid film of a photoresist, and the second temperature may be higher than the first temperature. A difference between a thickness (L1) connecting an upper surface and a bottom surface of the support plate and a depth (L2) of the buffer space may be 1.5 mm or less.

In accordance with another aspect of the inventive concept, there is provided a substrate treating system including an application device configured to form a photoresist film on a substrate, and a heating device configured to heat the photoresist film formed on the substrate, wherein the heating device includes a process chamber having a treatment space for treating the substrate in the interior thereof, and a substrate support apparatus configured to support the substrate in the treatment space, wherein the substrate support apparatus includes a substrate support member including a support plate having an upper surface, and a heating member provided in the support plate to heat the substrate, and wherein an area of the support plate has a buffer area, in which a buffer space for restricting a heat transfer rate of heat provided from the heating member to the upper surface is formed.

The heating member may include a first heater configured to heat a first area of the support plate to a first temperature, and a second heater configured to heat a second area of the support plate to a second temperature that is different from the first temperature, and when viewed from the top, the buffer area may be located between the first area and the second area. The first area may include a central area of the support plate, the second area may include a peripheral area of the support plate, and when viewed from the top, the buffer area may be provided to surround a circumference of the first area. The second temperature may be higher than the first temperature. A difference value between a thickness (L1) connecting an upper surface and a bottom surface of the support plate and a depth (L2) of the buffer space may be 1.5 mm or less.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
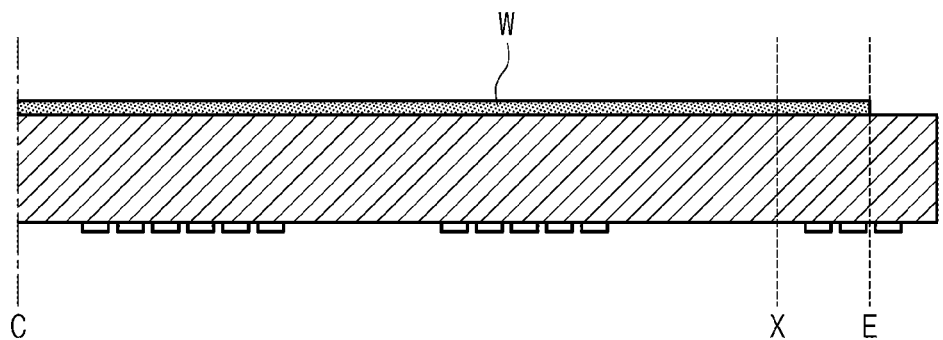
FIG. 1 is a sectional view illustrating a general baking apparatus.

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

The system of the present embodiment of the inventive concept may be used to perform a photography process on a substrate such as a semiconductor wafer or a flat display panel. In particular, the system of the present embodiment may be connected to an exposure apparatus to perform an application process and a development process on a substrate. However, in the embodiment, any apparatus that may form currents in a closed substrate treating space may be variously applied. Hereinafter, a case of using a circular wafer as a substrate may be described as an example.

Referring to FIGS. 3 to 6, the substrate treating system 1 includes a load port 100, an index module 200, a first buffer module 300, an application/development module 400, a second buffer module 500, a pre/post-exposure treating module 600, and an interface module 700. The load port 100, the index module 200, the first buffer module 300, the application/development module 400, the second buffer module 500, the pre/post-exposure treating module 600, and the interface module 700 are sequentially disposed in a row in one direction.

Hereinafter, a direction in which the load port 100, the index module 200, the first buffer module 300, the application/development module 400, the second buffer module 500, the pre/post-exposure treating module 600, and the interface module 700 are disposed will be referred to as a first direction 12, and a direction that is perpendicular to the first direction 12 when viewed from the top will be referred to as a second direction 14, and a direction that is perpendicular to the first direction 12 and the second direction 14 will be referred to as a third direction 16.

A substrate W is moved while being received in a cassette 20. Then, the cassette 20 has a structure that is sealed from the outside. For example, a front open unified pod (FOUP) that has a door on the front side may be used as the cassette 20.

Hereinafter, the load port 100, the index module 200, the first buffer module 300, the application/development module 400, the second buffer module 500, the pre/post-exposure treating module 600, and the interface module 700 will be described in detail.

Figure 2:
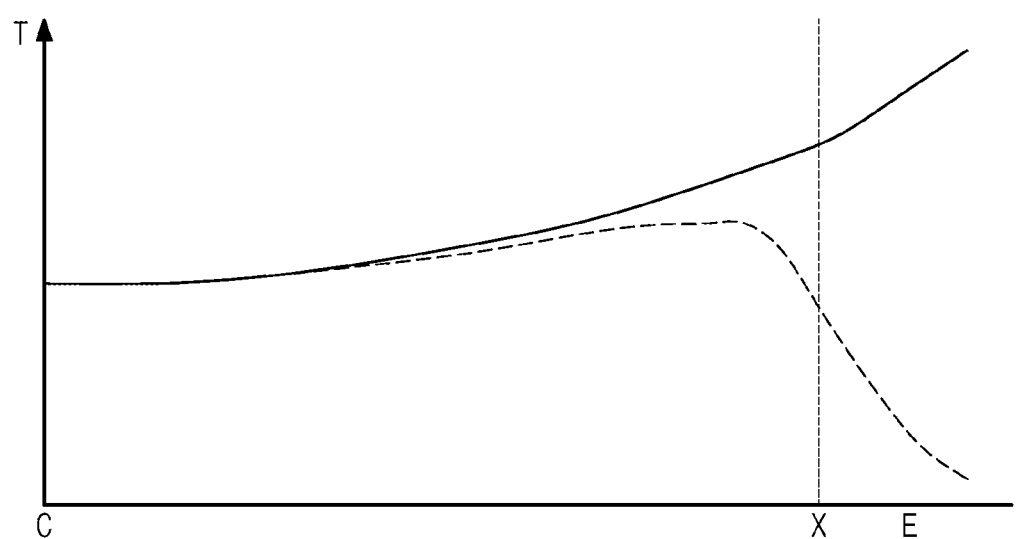
FIG. 2 is a graph depicting temperatures of areas of a substrate of FIG. 1.
Figure 3:
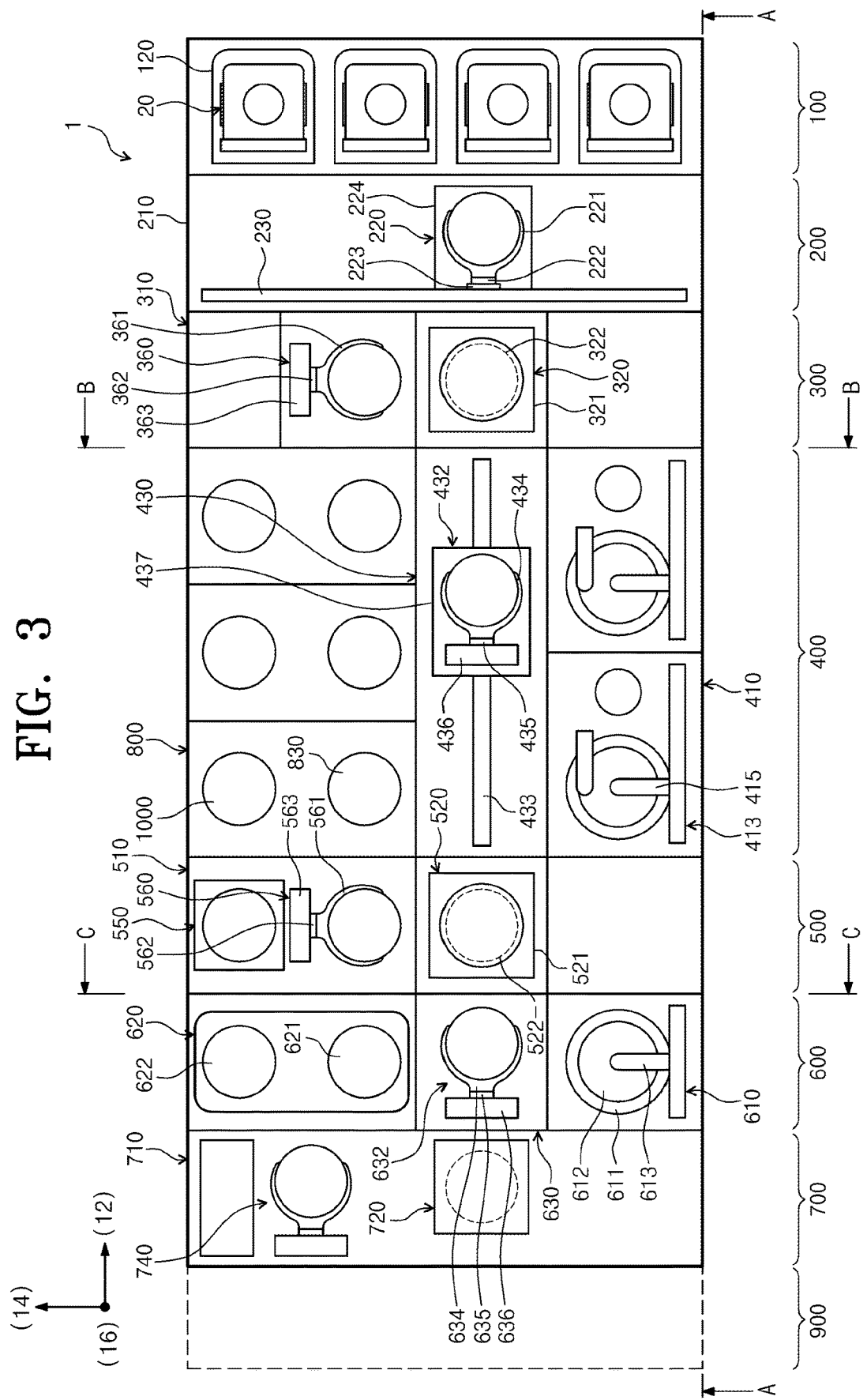
FIG. 3 is a plan view illustrating a substrate treating system according to an embodiment of the inventive concept.
Figure 4:
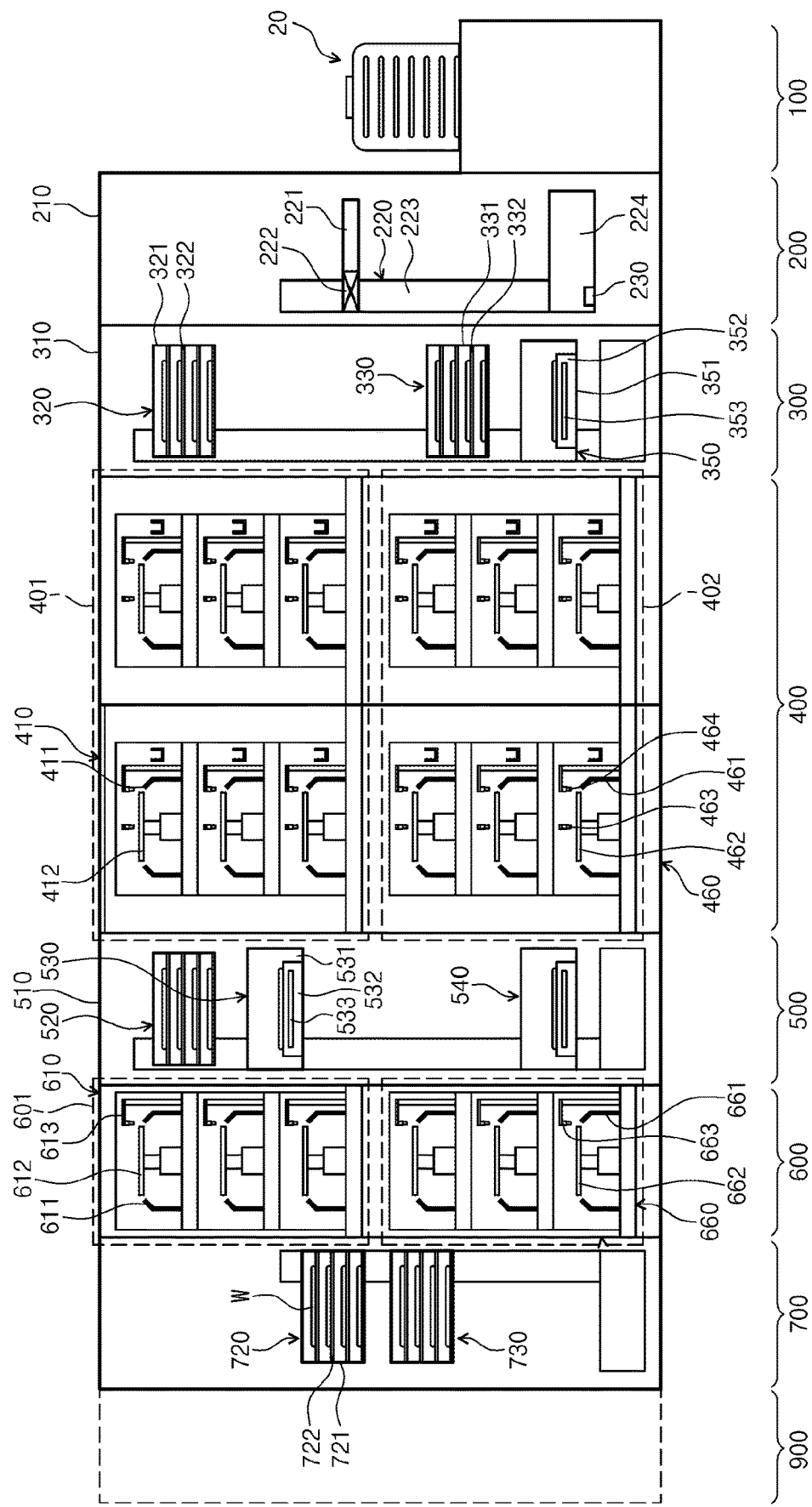
FIG. 4 is a sectional view of the system of FIG. 3, taken along line A-A of FIG. 3.
Figure 5:
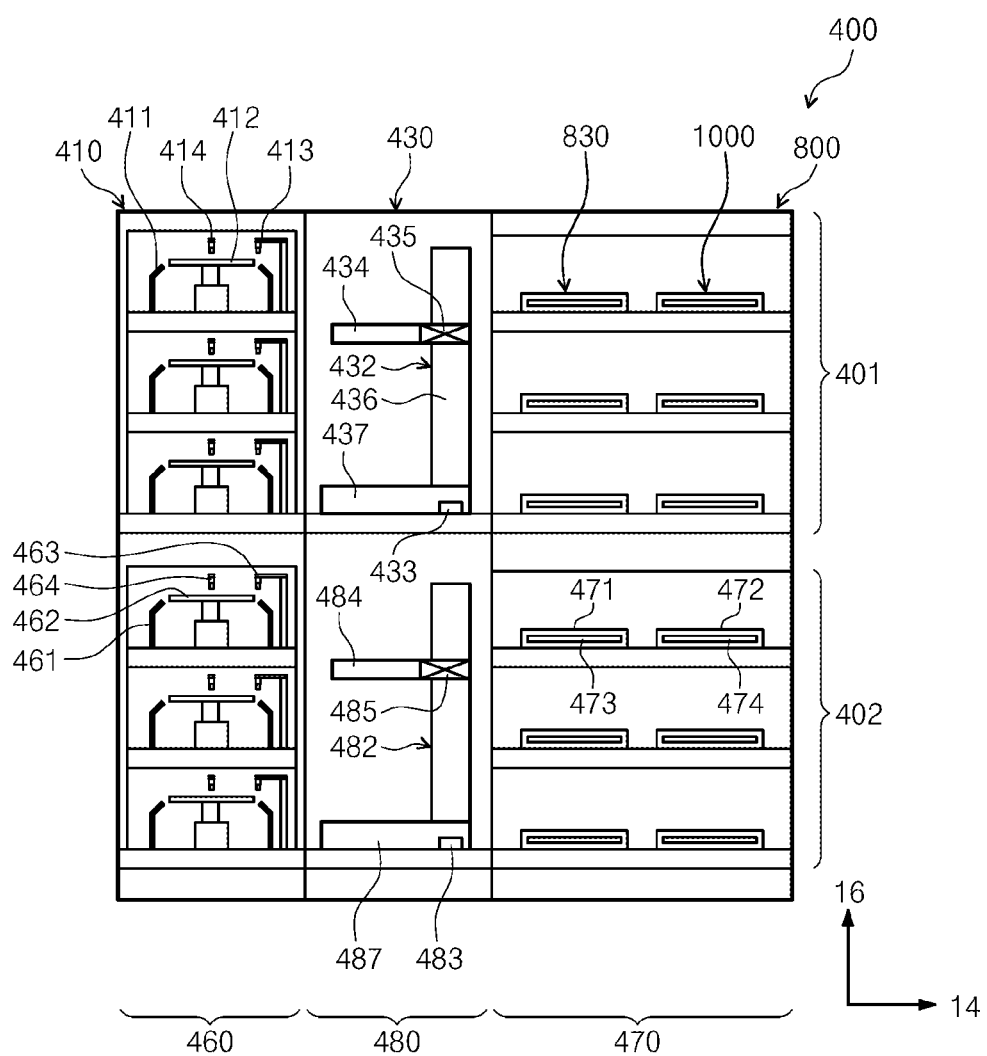
FIG. 5 is a sectional view of the system of FIG. 3, taken along line B-B of FIG. 3.
Figure 6:
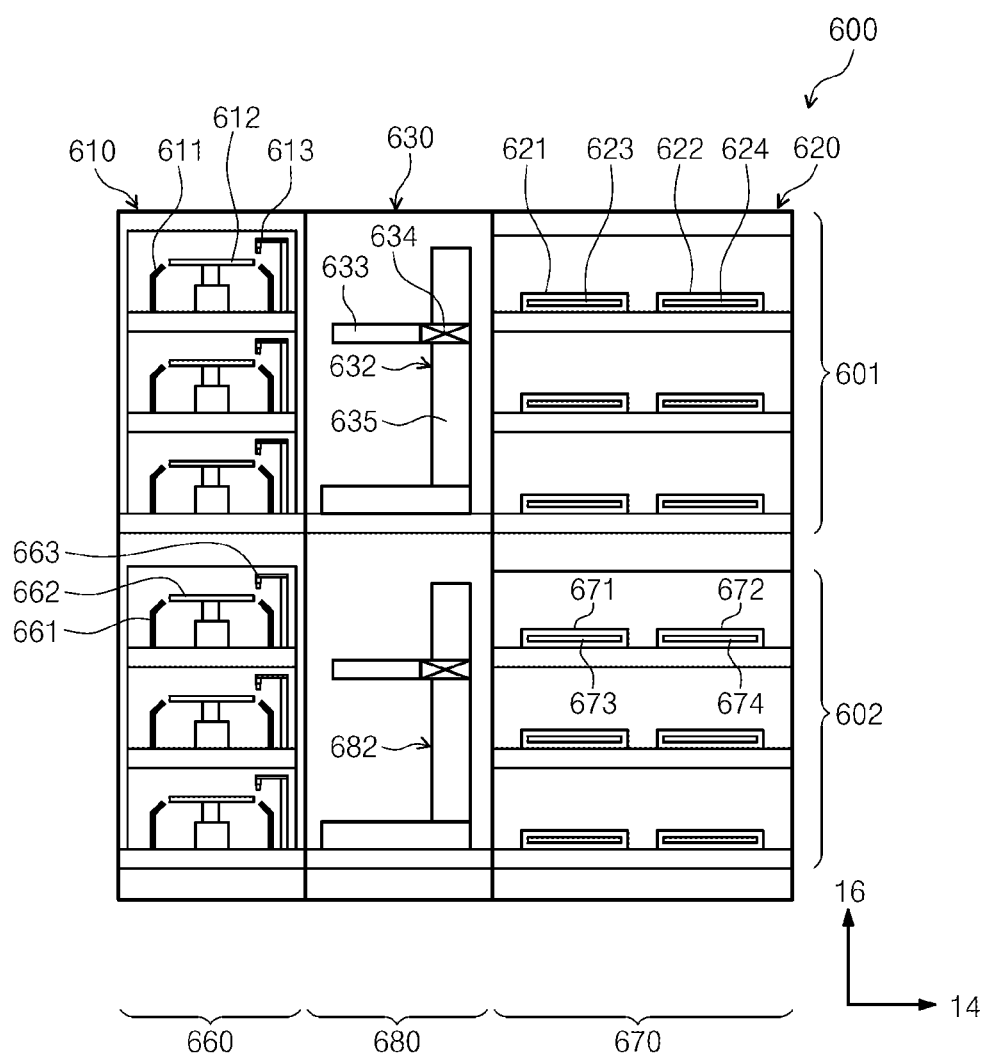
FIG. 6 is a sectional view of the system of FIG. 3, taken along line C-C of FIG. 3.

The load port 100 has a carrier 120 on which the cassette 20, in which the substrates W are received, is positioned. A plurality of carriers 120 are provided, and are disposed along the second direction 14 in a row. In FIG. 2, four carriers 120 are provided.

The index module 200 feeds a substrate W between the cassette 20 positioned on the carrier 120 of the load port 100 and the first buffer module 300. The index module 200 has a frame 210, an index robot 220, and a guide rail 230. The frame 210 has a substantially rectangular parallelepiped shape having an empty interior, and is disposed between the load part 100 and the first buffer module 300. The frame 210 of the index module 200 may have a height smaller than that of a frame 310 of the first buffer module 300, which will be described below. The index robot 220 and the guide rail 230 are disposed in the frame 210. The index robot 220 has a four-axis driven structure such that a hand 221 that directly handles a substrate W is movable and rotatable in the first direction 12, the second direction 14, and the third direction 16. The index robot 220 has a hand 221, an arm 222, a support 223, and a prop 224. The hand 221 is fixedly installed in the arm 222. The arm 222 is flexible and rotatable structure. The support 223 is configured such that the lengthwise direction thereof is disposed along the third direction 16. The arm 222 is coupled to the support 223 to be movable along the support 223. The support 223 is fixedly coupled to the prop 224. The guide rail 230 is provided such that the lengthwise direction thereof is disposed along the second direction 14. The prop 224 is coupled to the guide rail 230 to be linearly movable along the guide rail 230. Although not illustrated, the frame 210 is further provided with a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having an empty interior, and is disposed between the index module 200 and the application/development module 400. The first buffer 320, the second buffer 330, the cooling chamber 350, and the first buffer robot 360 are situated within the frame 310. The cooling chamber 350, the second buffer 330, and the first buffer 320 are disposed along the third direction 16 sequentially from the bottom. The first buffer 320 is situated at a height corresponding to an application module 401 of the application/development module 400, which will be described below, and the second buffer 330 and the cooling chamber 350 are situated at a height corresponding to a development module 402 of the application/development module 400, which will be described below. The first buffer robot 360 is spaced apart by a predetermined distance in the second direction 14 from the second buffer 330, the cooling chamber 350, and the first buffer 320.

The first buffer 320 and the second buffer 330 temporarily preserve a plurality of substrates W. The second buffer 330 has a housing 331 and a plurality of supports 332. The supports 332 are disposed within the housing 331, and are spaced apart from one another along the third direction 16. One substrate W is positioned on each of the supports 332. The housing 331 has openings (not illustrated) on a side on which the index robot 220 is provided, on a side on which the first buffer robot 360 is provided, and on a side on which a development robot 482 is provided so that the index robot 220, the first buffer robot 360, and a development robot 482 of the development module 402, which will be described below, carries a substrate W into or out of the support 332 in the housing 331. The first buffer 320 has a structure that is substantially similar to that of the second buffer 330. Meanwhile, the housing 321 of the first buffer 320 has an opening on a side on which the first buffer robot 360 is provided and on a side on which an application robot 432 situated in the application module 401, which will be described below, is provided. The number of supports 322 provided for the first buffer 320 and the number of supports 332 provided for the second buffer 330 may be the same or different. According to an embodiment, the number of the supports 332 provided for the second buffer 330 may be larger than the number of the supports 332 provided for the first buffer 320.

The first buffer robot 360 feeds a substrate W between the first buffer 320 and the second buffer 330. The first buffer robot 360 has a hand 361, an arm 362, and a support 363. The hand 361 is fixedly installed in the arm 362. The arm 362 has a flexible structure, and allows the hand 361 to be moved along the second direction 14. The arm 362 is coupled to the support 363 to be linearly movable in the third direction 16 along the support 363. The support 363 has a length extending from a location corresponding to the second buffer 330 to a location corresponding to the first buffer 320. The support 363 may be provided to extend longer upwards or downwards. The first buffer robot 360 may be provided such that the hand 361 is simply two-axis driven along the second direction 14 and the third direction 16.

The cooling chamber 350 cools a substrate W. The cooling chamber 350 has a housing 351 and a cooling plate 352. The cooling plate 352 has a cooling unit 353 that cools an upper surface thereof on which a substrate W is positioned and the substrate W. Various types such as a cooling type using cooling water and a cooling type using a thermoelectric element may be used as the cooling unit 353. A lift pin assembly (not illustrated) that locates a substrate W on the cooling plate 352 may be provided in the cooling chamber 350. The housing 351 has openings (not illustrated) on a side on which the index robot 220 is provided and on a side on which the development robot 482 is provided so that the index robot 220 and the development robot 482 provided for the development robot 402, which will be described below, carry a substrate W into or out of the cooling plate 352. Doors (not illustrated) that open and close the aforementioned openings may be provided in the cooling chamber 350.

The application/development module 400 performs a process of applying a photoresist onto a substrate W before an exposure process and a process of developing the substrate W after the exposure process. The application/development module 400 has a substantially rectangular parallelpiped shape. The application/development module 400 has an application module 401 and a development module 402. The application module 401 and the development module 402 may be disposed to be partitioned from each other in different layers. According to an example, the application module 401 is situated on the development module 402.

The application module 401 performs a process of applying a photosensitive liquid such as a photoresist onto a substrate W and a heat treating process of, for example, heating and cooling the substrate W before and after the resist applying process. The application module 401 has a resist applying unit 410, a baking unit 420, and a carrying chamber 430. The resist applying unit 410, the baking unit 420, and the carrying chamber 430 are sequentially disposed along the second direction 14. Accordingly, the resist applying unit 410 and the baking unit 420 are spaced apart from each other in the second direction 14 while the carrying chamber 430 is interposed therebetween. A plurality of resist applying units 410 may be provided, and a plurality of resist applying units 410 may be provided in each of the first direction 12 and the third direction 16. In the drawings, six resist applying units 410 are illustrated as an example. A plurality of baking units 420 may be provided in each of the first direction 12 and the third direction 16. In the drawings, six baking units 420 are illustrated as an example. However, unlike this, a smaller number of baking units 420 may be provided.

The carrying chamber 430 is situated in parallel to the first buffer 320 of the first buffer module 300 in the first direction 12. An application robot 432 and a guide rail 433 may be situated in the carrying chamber 430. The carrying chamber 430 has a substantially rectangular shape. The application robot 432 feeds a substrate W between the baking units 420, the resist applying units 400, the first buffer 320 of the first buffer module 300, and the first cooling chamber 520 of the second buffer module 500. The guide rail 433 is disposed such that the lengthwise direction thereof is parallel to the first direction 12. The guide rail 433 guides the application robot 432 such that the application robot 432 is linearly moved in the first direction 12. The application robot 432 has a hand 434, an arm 435, a support 436, and a prop 437. The hand 434 is fixedly installed in the arm 435. The arm 435 has a flexible structure such that the hand 434 is movable horizontally. The support 436 is provided such that the lengthwise direction thereof is disposed along the third direction 16. The arm 435 is coupled to the support 436 to be linearly movable in the third direction 16 along the support 436. The support 436 is fixedly coupled to the prop 437, and the prop 437 is coupled to the guide rail 433 to be movable along the guide rail 433.

The resist applying units 410 have the same structure. However, the types of photoresists used in the resist applying units 410 may be different. As an example, the photoresist may be a chemical amplification resist. The resist applying unit 410 applies a photoresist onto the substrate W. The resist applying unit 410 has a housing 411, a support plate 412, and a nozzle 413. The housing 411 has an open-topped cup shape. The support plate 412 is situated in the housing 411, and supports the substrate W. The support plate 412 may be provided to be rotatable. The nozzle 413 supplies a photoresist liquid onto the substrate W positioned on the support plate. 412. The nozzle 413 has circular pipe shape, and may supply a photoresist liquid to the center of the substrate W. Optionally, the nozzle 413 may have a length corresponding to the diameter of the substrate W, and the discharge hole of the nozzle 413 may be a slit. Further, additionally, a nozzle 414 for supplying a cleaning liquid such as deionized water to clean a surface of the substrate W, to which the photoresist is applied, may be further provided in the resist applying unit 410.

The baking unit 800 heat-treats the substrate W. The baking unit 800 heats the substrate W before and after the photoresist is applied. The baking unit 800 may heat the substrate W to a specific temperature such that a surface property of the substrate W before the photoresist is applied may be changed, and may form a treatment liquid film, such as an adhesive, on the substrate W. The baking unit 800 may heat the photoresist film while the substrate W, to which the photoresist has been applied, is in a pressure reduced atmosphere. A volatile material included in the photoresist film may be volatilized. In the embodiment, it is described that the baking unit 800 is a unit for heating the photoresist.

The baking unit 800 has a cooling plate 820 and a heating plate 1000. The cooling plate 820 cools the substrate W heated by the heating unit 1000. The cooling plate 820 is provided to have a circular plate shape. Cooling water or a cooling unit, such as a thermoelectric element, is provided in the interior of the cooling plate 820. For example, the substrate W positioned on the cooing plate 820 may be cooled to a room temperature or a temperature that is close to the room temperature.

Figure 7:
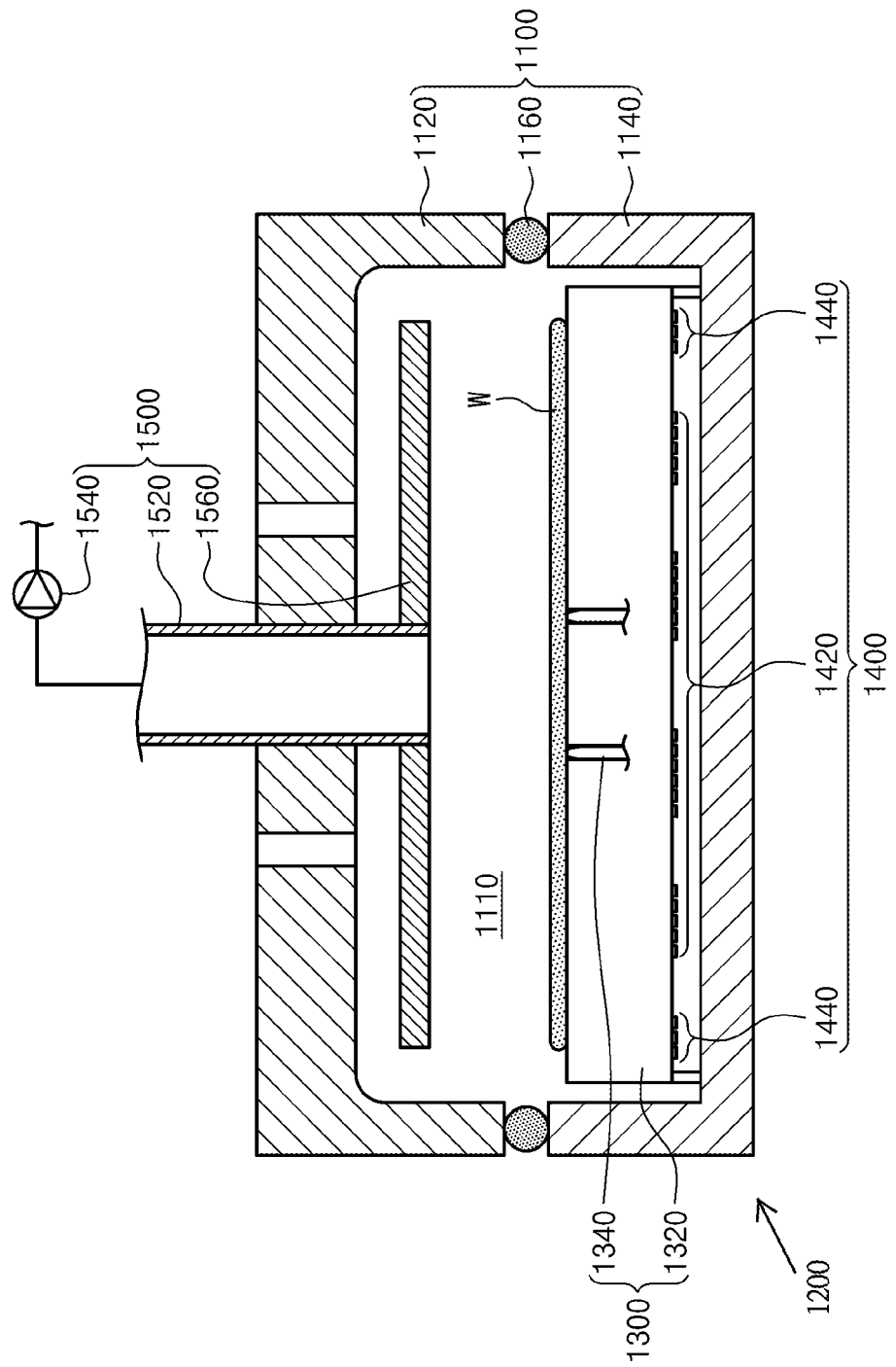
FIG. 7 is a sectional view illustrating a heating apparatus of FIG. 3.

The hearing unit 100 heats the substrate W at a normal pressure or a reduced pressure that is lower than the normal pressure. The heating unit 1000 may provide the substrate W to the heating apparatus 1000 that heats the substrate W. FIG. 7 is a sectional view illustrating a heating unit of FIG. 3. Referring to FIG. 7, the heating unit 1000 includes a chamber 1100, an exhaustion unit 1500, and a substrate support apparatus 1200.

The chamber 1100 has a treatment space 1110, in which the substrate W is heated, in the interior thereof. The treatment space 1110 is a space that is blocked from the outside. The chamber 1100 includes an upper body 1120, a lower body 1140, and a sealing member 1160.

The upper body 1120 has a bottom-topped vessel shape. A central hole 1122 and a peripheral hole 1124 are formed on an upper surface of the upper body 1120. The central hole 1122 is formed at the center of the upper body 1120. The central hole 1122 functions as an exhaustion hole 1122, through which an atmosphere of the treatment space 1110 is exhausted. A plurality of peripheral holes 1124 are provided, and are formed at locations that deviate from the center of the upper body 1120. The peripheral holes 1124 function as introduction holes 1124, through which exterior currents are introduced into the treatment space 1110. The peripheral holes 1124 are located to surround the central holes 1122. The peripheral holes 1124 are locate to be spaced apart from each other along a circumferential direction. According to an example, four peripheral holes 1124 may be provided. The exterior currents may be air.

Selectivity, three or five peripheral holes 1124 may be provided. Further, the exterior currents may be an inert gas.

The upper body 1140 has an open-topped vessel shape. The lower body 1140 is located below the upper body 1120. The upper body 1120 and the lower body 1140 are located to face each other vertically. The upper body 1120 and the lower body 1140 are combined with each other to form a treatment space 1110 therebetween. The upper body 1120 and the lower body 1140 are located such that the central axes of the upper body 1120 and the lower body 1140 coincide with each other with respect to a vertical direction. The lower body 1140 may have the same diameter as that of the upper body 1120. That is, an upper end of the lower body 1140 may be located to be opposite to a lower end of the upper body 1120.

One of the upper body 1120 and the lower body 1140 is moved to an opening location and an interruption location by an elevation member 1130, and the location of the other of the upper body 1120 and the lower body 1140 is fixed. According to an embodiment, the location of the lower body 1140 may be fixed, and the upper body 1120 may be moved between an opening location and an interruption location by the elevation member 1130. Here, the opening location is a location at which the upper body 1120 and the lower body 1140 are spaced apart from each other so that the treatment space 1110 is opened. The interruption location is a location at which the treatment space 1110 is closed from the outside by the lower body 1140 and the upper body 1120.

The sealing member 1160 is located between the upper body 1120 and the lower body 1140. The sealing member 1160 seals an aperture between the upper body 1120 and the lower body 1140. The sealing member 1160 may be an O-ring member 1160 having an annular ring shape. The sealing member 1160 may be fixedly coupled to an upper end of the lower body 1140.

The exhaustion unit 1500 exhausts the atmosphere of the treatment space 1110. The exhaustion unit 1500 includes an exhaustion pipe 1520, a pressure reducing member 1540, and a facing plate 1560. The exhaustion pipe 1520 has a pipe shape, opposite ends of which are opened. The exhaustion pipe 1520 is provided such that a lengthwise direction of the exhaustion pipe 1520 faces a vertical direction. The exhaustion pipe 1520 is fixedly coupled to the upper body 1120. The exhaustion pipe 1520 is located to pass through the central hole 1122 of the upper body 1120. A lower area of the exhaustion pipe 1520, which includes a lower end of the exhaustion pipe 1520, is located in the treatment space 1110, and an upper area of an exhaustion pipe 1520, which includes an upper end of the exhaustion pipe 1520, is located outside the treatment space 1110. That is, an upper end of the exhaustion pipe 1520 is located to be higher than the upper body 1120. The exhaust pipe 1520 is connected to the pressure reducing member 1540. The pressure reducing member 1540 reduces a pressure of the exhaustion pipe 1520. Accordingly, the treatment space 110 may be exhausted through the exhaustion pipe 1520.

The facing plate 1560 guides a flow direction of the currents introduced into the treatment space 1110. The facing plate 1560 guides a flow direction of the currents in the treatment space 1110. The facing plate 1560 has a plate shape having a vent hole 1620. The vent hole 1620 is formed at the center of the facing plate 1560. The facing plate 1560 is located at an upper portion of the support plate 1320 in the treatment space 1110. The facing plate 1560 is located at a height corresponding to the upper body 1120. The facing plate 1560 is located to face the support plate 1320. The facing plate 1560 is located such that the exhaustion pipe 1520 is inserted into the vent holed 1620. For example, the vent hole 1620 may have the same diameter as that of the exhaustion pipe 1520. The exhaustion pipe 1520 is inserted into and coupled to the vent hole 1620 of the facing plate 1560. The facing plate 1560 is fixedly coupled to a lower end of the exhaustion pipe 1520. The facing plate 1560 is provided to have an outer diameter that is smaller than the inner diameter of the upper body 1120. Accordingly, an aperture is formed between a side end of the facing plate 1560 and an inner surface of the upper body 1120. A flow direction of the currents introduce into the treatment space 1110 is guided by the facing plate 1560, and the currents are supplied through the aperture. According to an embodiment, when viewed from the top, the facing plate 1560 may overlap the peripheral hole 1124. The facing plate 1560 is provided to have a diameter that is larger than a seating surface, on which the substrate W is seated.

The substrate support apparatus 1200 includes a substrate support member 1300 and a heating member 1400. The substrate support member 1300 supports the substrate W in the treatment space 1110. The substrate support member 1300 is fixedly coupled to the lower body 1140. The substrate support member 1300 includes a support plate 1320 and a lift pin 1340. The substrate support unit 1320 supports the substrate W in the treatment 1110. The support plate 1320 has a circular disk shape. The substrate W may be seated on the upper surface of the support plate 1320. A central area of the upper surface of the support plate 1320, which includes the center of the upper surface of the support plate 1320, functions as a seating surface, on which the substrate W is seated. That is, the upper surface of the support plate 1320 has a diameter that is larger than the substrate W. A plurality of pin holes 1322 are formed on a seating surface of the support plate 1320. When viewed from the top, the pin holes 1322 are arranged to surround the center of the seating surface. The pin holes 1322 are arranged to be spaced apart from each other along a circumferential direction. The pin holes 1322 are space apart from each other at the same interval. A lift pin 1340 is provided in each of the pin holes 1322. The lift pin 1340 is provided to be moved vertically. The lift pin 1340 raises the substrate W from the support plate 1320, or seats the substrate W on the support plate 1320. For example, three pin holes 1322 may be provided.

Further, the support plate 1320 has a first area A, a second area B, and a buffer area C. When viewed from the top, the first area A, the buffer area C, and the second are B are provided as different areas. When viewed from the top, the support plate 1320 has a first area A, a buffer area C, and a second area B that are sequentially arranged as they go away from the center. That is, the buffer area C may have an annularring shape that surrounds the first area A, and the second area B may have an annular ring shape that surrounds the buffer area C. According to an example, the first area A may be a central area of the support plate 1320, and the second area B may be a peripheral area of the support plate 1320. The buffer area C may restrict a heat transfer rate of the heat provided from the heating member 1400 to the seating surface. The buffer area C may include a buffer space 1360. The buffer space 1360 may be an empty space filled with air or in a vacuum state. When the vertical section of the buffer area C is viewed from the front side, the buffer space 1360 may have a tetragonal shape having a constant depth. The support plate 1320 may be formed of a material including aluminum nitride (AlN).

Figure 8:
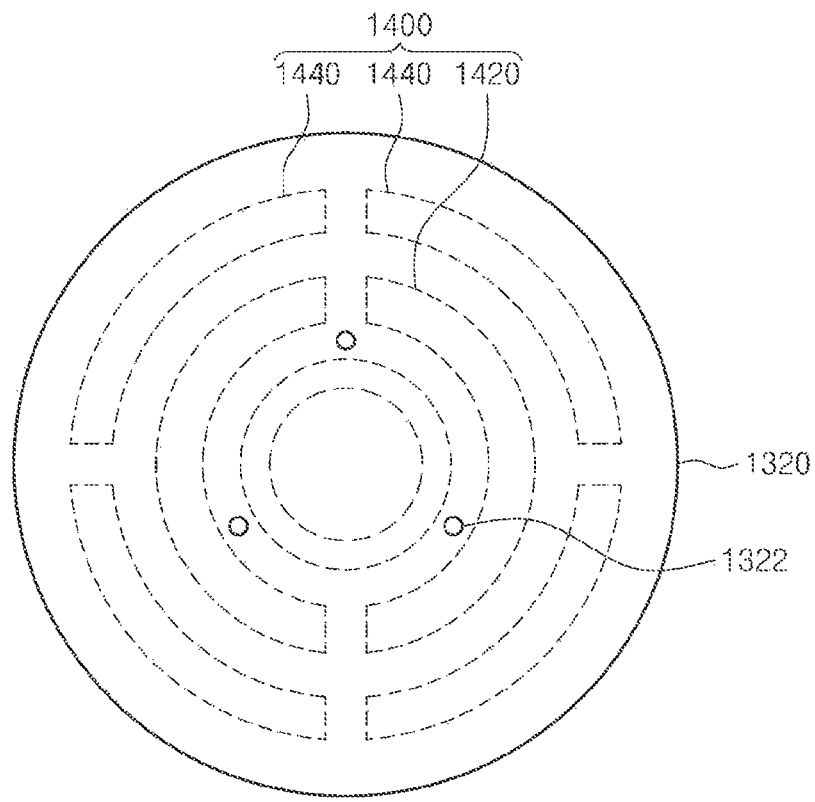
FIG. 8 is a plan view illustrating a support plate and a heating member of FIG. 7.

The heating member 1400 heats the substrate W positioned on the support plate 1320. The heating member 1400 is provided in the support plate 1320. The heating member 1400 includes a first heater 1420 and a second heater 1440. FIG. 8 is a plan view illustrating a support plate and a heating member of FIG. 7. Referring to FIG. 8, the first heater 1420 and the second heater 1440 are installed on a bottom surface of the support plate 1320. The first heater 1420 and the second heater 1440 are located on the same plane. The first heater 1420 and the second heater 1440 heat different areas of the support plate 1320. When viewed from the top, the areas of the support plate 1320 corresponding to each of the first heaters 1420 and the second heater 1440 may be provided as heating zones. The temperatures of the heaters may be independently adjusted. For example, fifteen heating zones may be provided. The temperatures of the heating zones are measured by sensors (not illustrated). The heaters 1400 may be thermoelectric elements or heating wires. Selectively, the heaters 1400 may be mounted on the bottom surface of the support plate 1320.

Figure 9:
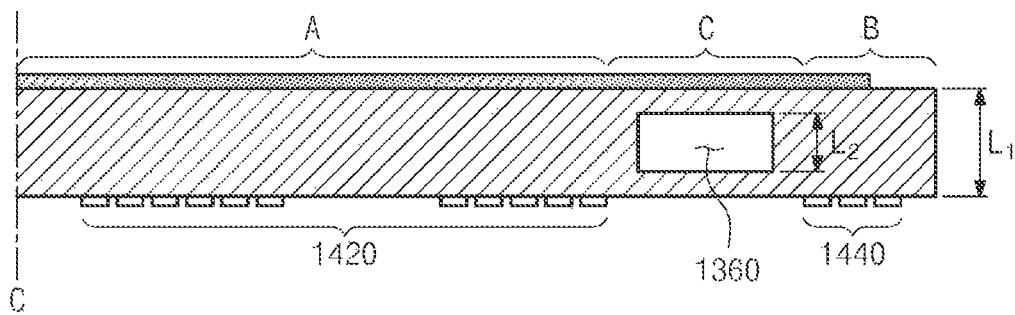
FIG. 9 is a sectional view illustrating a first embodiment of the support plate and the heating member of FIG. 7.
Figure 10:
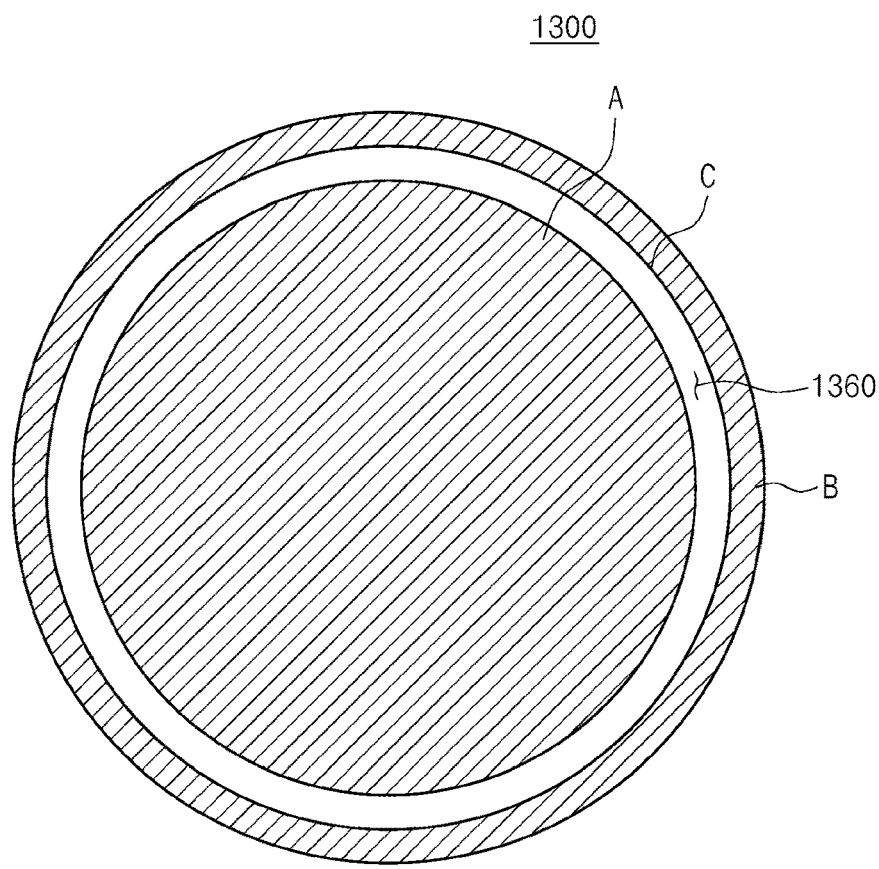
FIG. 10 is a plan view illustrating a buffer space of the support plate of FIG. 7.

FIG. 9 is a sectional view illustrating a first embodiment of the support plate and the heating member of FIG. 7. FIG. 10 is a plan view illustrating a buffer space of the support plate of FIG. 7. Referring to FIGS. 9 and 10, the first heater 1420 is installed on a first area A of the support plate 1320 and the second heater 1440 is installed in a second area B of the support plate 1320. The first heater 1420 heats the first area A to a first temperature T1, and the second heater 1440 heats the second area B to a second temperature T2. According to an embodiment, the second temperature T2 may be a temperature that is higher than the first temperature T1.

Next, a locational relationship between the areas of the support plate 1320 and the heating member 1400 will be described in more detail.

When viewed from the top, the buffer area C is located between the first area A and the second area B. The buffer area C may have an annularring shape. That is, the buffer area C may have an annular ring shape that surrounds the first area A, and the second area B may have an annular ring shape that surrounds the buffer area C. The buffer space 1360 formed in the buffer area C is an empty space filled with air or in a vacuum state. The buffer space 1360 functions as an insulation layer that insulates conduction heat that is conducted from the heaters 1420 and 1440 to the support plate 1320. The buffer space 1360 is spaced apart from the upper surface and the bottom surface of the support plate 1320. When viewed from the top, the heating member 1400 and the buffer space 1360 are located not to overlap each other. According to an example, a difference value between a thickness L1 connecting the upper surface and the bottom surface of the support plate 1320 and a depth L2 of the buffer space 1360 may be 1.5 mm or less. As the difference value becomes smaller, the insulation effect increases.

The substrate W seated on the support plate 1320 is classified to have a central area, a temperature gradient area, and a peripheral area. The central area of the substrate W faces the first area A of the support plate 1320. The temperature gradient area of the substrate W faces the buffer area C. The peripheral area of the substrate W faces the second area B. The areas of the substrate W are heated by the first heater 1420 and the second heater 1440, and a temperature gradient between the central area and the peripheral area may be generated in the temperature gradient area.

Figure 11:
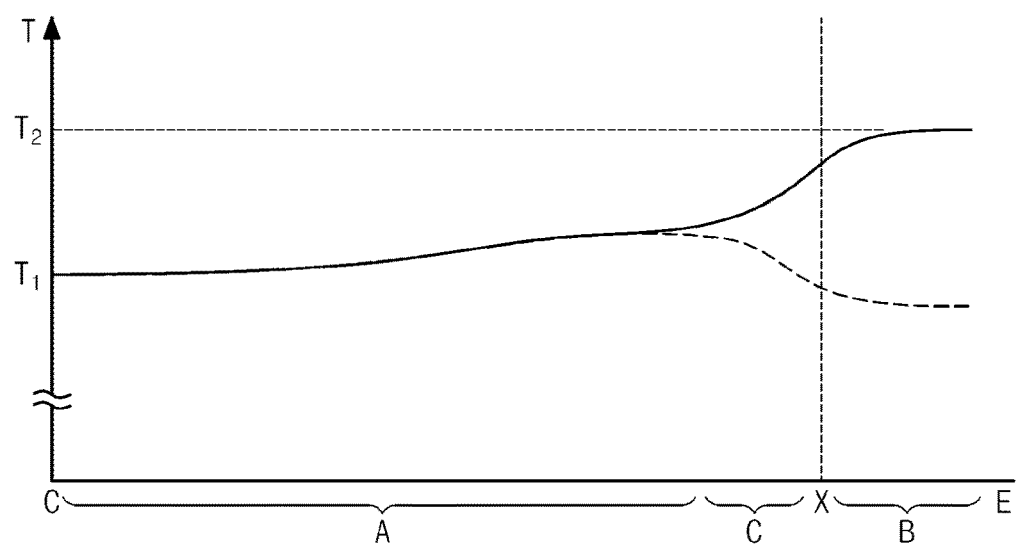
FIG. 11 is a graph depicting temperatures of areas of the substrate heated by the support plate and the heating member of FIG. 9.

Next, a method for heating a substrate W by using the aforementioned substrate heating apparatus will be described. FIG. 11 is a graph depicting temperatures of areas of the substrate heated by the support plate and the heating member of FIG. 9.

Referring to FIG. 11, if a substrate W having a photoresist film is seated on the upper surface of the support plate 1320, the treatment space 1110 is closed. The heating member 1400 heats the support plate 1320, and heats the substrate W through conduction heat of the support plate 1320. The first heater 1420 heats the first area A to a first temperature T1, and the second heater 1440 heats the second area B to a second temperature T2 that is higher than the first temperature T1. The first temperature T1 by the first heater 1420 is conducted from the bottom surface of the first area A of the support plate 1320 to the upper surface of the first area A. The second temperature T2 by the second heater 1440 is conducted from the bottom surface of the second area B of the support plate 1320 to the upper surface of the second area B. The buffer space 1360 interferes conduction of the first temperature T1 to the upper surface of the second area B, and interferes conduction of the second temperature T2 to the upper surface of the first area A. Accordingly, the central area of the substrate W is uniformly heated to the first temperature T1, and the peripheral area of the substrate W is uniformly heated to the second temperature T2. The temperature gradient area of the substrate W is heated from the first temperature T1 to a temperature that is close to the second temperature T2 as it becomes close to the peripheral area of the substrate W. For example, the first temperature T1 may be 400□ and the second temperature T2 may be 420□.

Next, various modifications of the substrate 1320 will be described.

Figure 12:
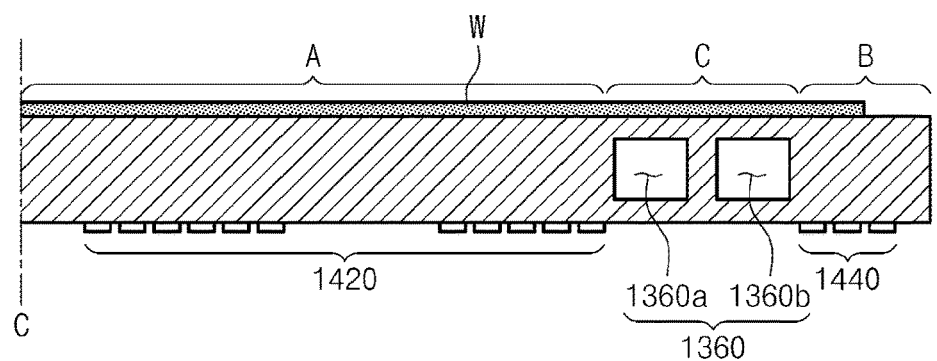
FIG. 12 is a sectional view illustrating a second embodiment of the support plate of FIG. 9.

As illustrated in FIG. 12, according to the second embodiment of the support plate 1320, the buffer space 1360 may include an inside space 1360a and an outside space 1360b. The inside space 1360a and the outside space 1360b may be provided as independent spaces. The inside space 1360a and the outside space 1360b may be located between the first area A and the second area B. When viewed from the top, the inside space 1360a may be provided to surround the first area A of the support plate 1320 and the outside space 1360b may be provided to surround the inside space 1360a of the buffer space 1320. The outside space 1360b may have a depth that is larger than the depth of the inside space 1360a.

Figure 13:
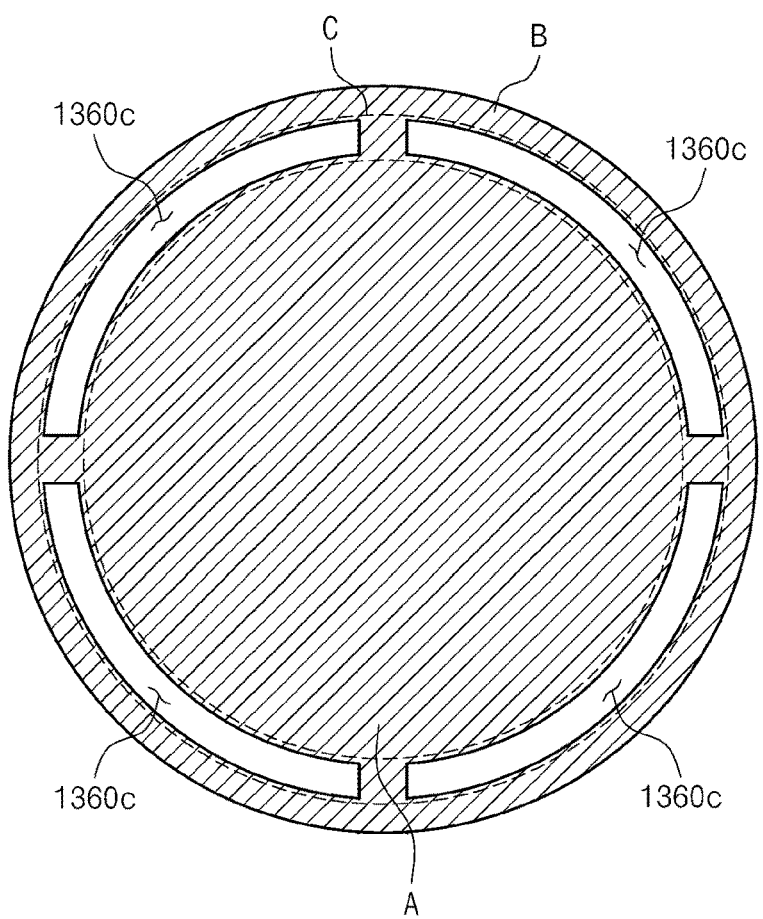
FIG. 13 is a plan view illustrating a third embodiment of the support plate of FIG. 9.

Further, as illustrated in FIG. 13, the buffer space 1360 may have a plurality of divided spaces 1360c that are arranged circumferentially. The divided spaces 1360c may be located to be spaced apart from each other at the same interval.

Figure 14:
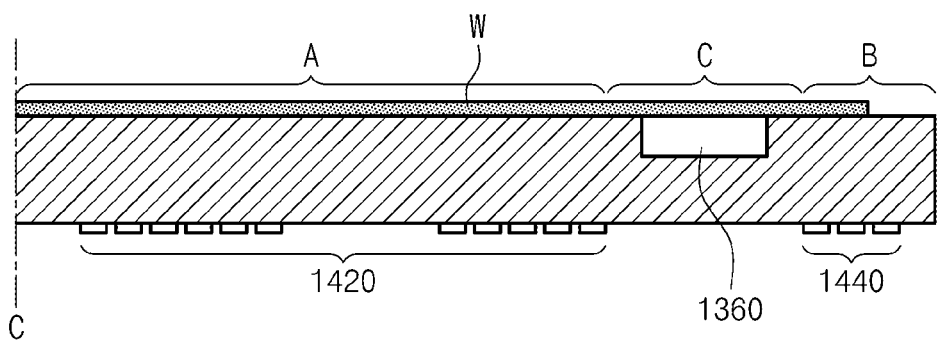
FIG. 14 is a sectional view illustrating a fourth embodiment of the support plate of FIG. 9.

Further, as illustrated in FIG. 14, the buffer space 1360 may be provided to communicate with the upper space of the support plate 1320. That is, the buffer space 1360 may be a recess formed on the upper space of the buffer area C.

Figure 15:
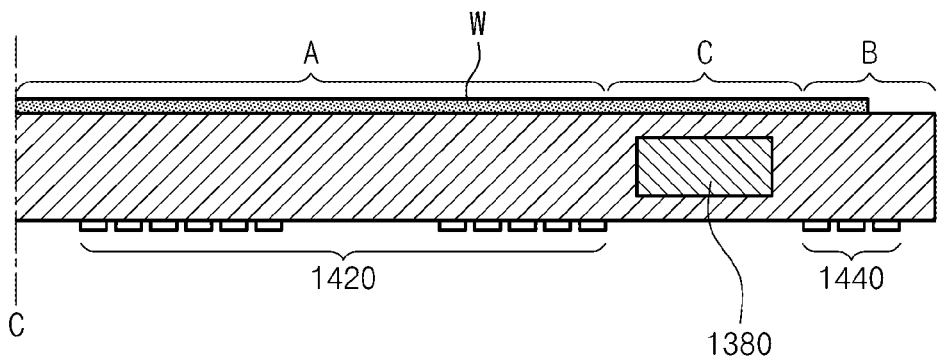
FIG. 15 is a sectional view illustrating a fifth embodiment of the support plate of FIG. 9.

Further, as illustrated in FIG. 15, the buffer space 1360 may be filled with an insulation body 1380 having a material that is different from those of the first area A, the buffer area C, and the second area B. The insulation body 1380 may be formed of a material, a thermal conductivity of which is lower than those of the materials of the first area A, the buffer area C, and the second area B. The insulation body 1380 may be formed of a material, a thermal conductivity of which is lower than that of aluminum nitride (AlN).

Figure 16:
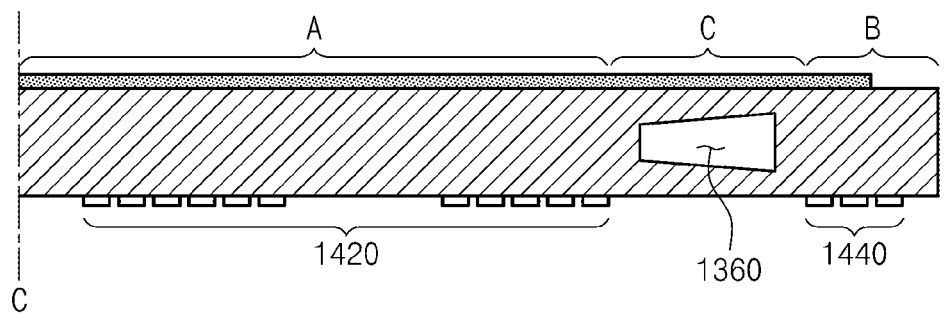
FIG. 16 is a sectional view illustrating a sixth embodiment of the support plate of FIG. 9.
Figure 17:
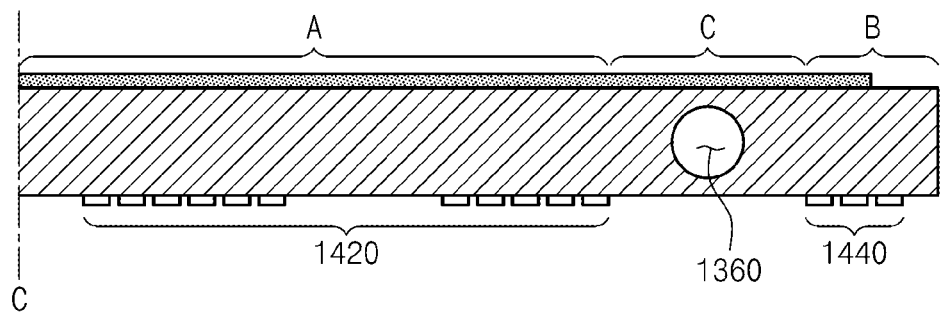
FIG. 17 is a sectional view illustrating a seventh embodiment of the support plate of FIG. 9.

Further, as illustrated in FIGS. 16 and 17, the buffer 1360 may have a shape, a depth of which varies. The depth of the buffer space 1360 increases as it becomes far away from the center of the support plate 1320. When the vertical section of the buffer area C is viewed from the front side, the buffer space 1360 may have a trapezoidal shape. Unlike this, when the vertical section of the buffer area C is viewed from the front side, the buffer space 1360 may have a circular shape. Selectively, when the vertical section of the buffer area C is viewed from the front side, the buffer space 1360 may have a elliptical shape. Further, when the vertical section of the buffer area C is viewed from the front side, the buffer space 1360 may have a triangular shape.

Further, when viewed from the top, a part of the buffer space 1360 may be located to overlap the first area A.

Referring to FIGS. 3 to 6 again, the development module 402 includes a process of eliminating a photoresist by supplying a development liquid to obtain a pattern on the substrate W, and a heat treating process, such as heating and cooling, which are performed on the substrate W before and after the development process. The development module 402 has a development unit 460, a baking unit 470, and a carrying chamber 480. The development unit 460, the baking unit 470, and the carrying chamber 480 are sequentially disposed along the second direction 14. Accordingly, the development unit 460 and the baking unit 470 are spaced apart from each other in the second direction 14 while the carrying chamber 480 is interposed therebetween. A plurality of development units 460 may be provided, and a plurality of development chambers 460 may be provided in each of the first direction 12 and the third direction 16. In the drawings, six development units 460 are illustrated as an example. A plurality of baking units 470 may be provided in each of the first direction 12 and the third direction 16. In the drawings, six baking units 470 are illustrated as an example. However, unlike this, a larger number of baking units 470 may be provided.

The carrying chamber 480 is situated in parallel to the second buffer 330 of the first buffer module 300 in the first direction 12. A development robot 482 and a guide rail 483 may be situated in the carrying chamber 480. The carrying chamber 480 has a substantially rectangular shape. The development robot 482 feeds the substrate W between the baking units 470, the development units 460, the second buffer 330 and the cooling chamber 350 of the first buffer module 300, and the second cooling chamber 540 of the second buffer module 500. The guides rail 483 is disposed such that the lengthwise direction thereof is parallel to the first direction 12. The guide rail 483 guides the development robot 482 such that the development robot 432 is linearly moved in the first direction 12. The development robot 482 has a hand 484, an arm 485, a support 486, and a prop 487. The hand 484 is fixedly installed in the arm 485. The arm 485 has a flexible structure such that the hand 484 is movable horizontally. The support 486 is provided such that the lengthwise direction thereof is disposed along the third direction 16. The arm 485 is coupled to the support 486 to be linearly movable in the third direction 16 along the support 486. The support 486 is fixedly coupled to the prop 487. The prop 487 is coupled to the guide rail 483 to be linearly moveable along the guide rail 483.

The development units 460 have the same structure. However, the types of development liquids used in the development units 460 may be different. The development units 460 eliminate an area of the photoresist on the substrate W, to which light is irradiated. Then, an area of the protective film, to which light is irradiated, is eliminated together. Optionally, only an area of the photoresist and the protective film, to which light is not irradiated, may be eliminated according to the type of the used photoresist.

The development unit 460 has a housing 461, a support plate 462, and a nozzle 463. The housing 461 has an open-topped cup shape. The support plane 462 is situated in the housing 461, and supports the substrate W. The support plate 462 may be provided to be rotatable. The nozzle 463 supplies a development liquid onto the substrate W positioned on the support plate 462. The nozzle 463 may have a circular pipe shape, and may supply a development liquid to the center of the substrate W. Optionally, the nozzle 463 may have a length corresponding to the diameter of the substrate W, and the discharge hole of the nozzle 463 may be a slit. The development unit 460 may be further provided with a nozzle 464 that supplies a cleaning liquid such as deionized water to clean the surface of the substrate W, to which the development liquid is additionally supplied.

The baking unit 470 of the development module 402 heat-treats the substrate W. For example, the baking units 470 may perform a post bake process of heating the substrate W before the development process, a hard bake process of heating the substrate W after the development process, and a cooling process of cooling the heated substrate W after the bake process. The baking unit 470 has a cooling plate 471 and a heating unit 472. The cooling plate 471 is provided with a cooling unit 473 such as cooling water or a thermo-electric element. The heating unit 472 is provided with a heating unit 474 such as heating wire or a thermoelectric element. The cooling plate 417 and the heating unit 472 may be provided in one baking unit 470. Optionally, some of the baking units 470 may include only a cooling plate 471, and some of the bake chambers 470 may include only a heating unit 472. Because the baking units 470 of the development module 402 have the same configuration as that of the baking units 800 of the application module 401, a detailed description thereof will be omitted.

The second buffer module 500 is provided as a passage through which the substrate W is transported, between the application/development module 400 and the pre/post-exposure module 600. The second buffer module 500 performs a process such as a cooling process or an edge exposing process on the substrate W. The second buffer module 500 has a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are situated in the frame 510. The buffer 520, the first cooling chamber 530, and the edge exposing chamber 550 are disposed at a height corresponding to the application module 401. The second cooling chamber 540 is disposed at a height corresponding to the development module 402. The buffer 520, the first cooling chamber 530, and the second cooling chamber 540 are disposed in a row along the third direction 16. When viewed from the top, the buffer 520 is disposed along the carrying chamber 430 of the application module 401 in the first direction 12. The edge exposing chamber 550 is spaced apart from the buffer 520 or the first cooling chamber 530 by a predetermined distance in the second direction 14.

The second buffer robot 560 transports the substrate W between the buffer 520, the first cooling chamber 530, and the edge exposing chamber 550. The second buffer robot 560 is situated between the edge exposing chamber 550 and the buffer 520. The second buffer robot 560 may have a structure that is similar to that of the first buffer robot 360. The first cooling chamber 530 and the edge exposing chamber 550 perform a succeeding process on the substrates W, on which the application module 401 has performed a process. The first cooling chamber 530 cools the substrate W, on which the application module 401 has performed a process. The first cooling chamber 530 has a structure similar to that of the cooing chamber 350 of the first buffer module 300. The edge exposing chamber 550 exposes peripheries of the substrates W, on which the first cooling chamber 530 has performed a cooling process. The buffer 520 temporarily preserves the substrates W before the substrates W, on which the edge exposing chamber 550 has performed a process, are transported to a pre-treatment module 601, which will be described below. The second cooling chamber 540 cools the substrates W before the substrates W, on which a post-treatment module 602, which will be described below, has performed a process, are transported to the development module 402. The second buffer module 500 may further have a buffer at a height corresponding to the development module 402. In this case, the substrates W, on which the post-treatment module 602 has performed a process, may be transported to the development module 402 after being temporarily preserved in the added buffer.

When the exposure apparatus 900 performs an immersion/exposure process, the pre/post-exposure module 600 may perform a process of applying a protective film that protects the photoresist film applied to the substrate W during the immersion/exposure process. The pre/post-exposure module 500 may perform a process of cleaning the substrate W after the exposure process. Furthermore, when the application process is performed by using a chemical amplification resist, the pre/post-exposure module 600 may perform a bake process after the exposure process.

The pre/post-exposure module 600 has a pre-treatment module 601 and a post-treatment module 602. The pre-treatment module 601 performs a process of treating the substrate W before the exposure process, and the post-treatment module 602 performs a process of treating the substrate W after the exposure process. The pre-treatment module 601 and the post-treatment module 602 may be disposed to be partitioned from each other in different layers. According to an example, the pre-treatment module 601 is situated on the post-treatment module 602. The pre-treatment module 601 has the same height as that of the application module 401. The post-treatment module 602 has the same height as that of the development module 402. The pre-treatment module 601 has a protective film applying unit 610, a baking unit 620, ad a carrying chamber 630. The protective film applying unit 610, the carrying chamber 630, and the baking unit 620 are sequentially disposed along the second direction 14. Accordingly, the protective film applying unit 610 and the baking unit 620 are spaced apart from each other in the second direction 14 while the carrying chamber 630 is interposed therebetween. A plurality of protective film applying units 610 are provided, and the plurality of protective film applying units 610 are disposed along the third direction 16 to form different layers. Optionally, a plurality of protective film applying units 610 may be provided in each of the first direction 12 and the direction 16. A plurality of baking units 620 are provided, and the plurality of bake units 610 are disposed along the third direction 16 to form different layers. Optionally, a plurality of baking units 620 may be provided in each of the first direction 12 and the third direction 16.

The carrying chamber 630 is situated in parallel to the first cooling chamber 530 of the second buffer module 500 in the first direction 12. A pre-treatment robot 632 is situated in the carrying chamber 630. The carrying chamber 630 has a substantially square or rectangular shape. The pre-treatment robot 632 feeds the substrate W between the protective film applying units 610, the baking units 620, the buffer 520 of the second buffer module 500, and a first buffer 720 of the interface module 700, which will be described below. The pre-treatment robot 632 has a hand 633, an arm 634, and a support 635. The hand 633 is fixedly installed in the arm 634. The arm 634 has a flexible and rotatable structure. The arm 634 is coupled to the support 635 to be linearly movable in the third direction 16 along the support 635.

The protective film applying unit 610 applies a protective film that protects a resist film during the immersion/exposure process, onto the substrate W. The protective film applying unit 610 has a housing 611, a support plate 612, and a nozzle 613. The housing 611 has an open-topped cup shape. The support plate 612 is situated in the housing 611, and supports the substrate W. The support plate 612 may be provided to be rotatable. The nozzle 613 supplies a protection liquid for forming a protective film onto the substrate W positioned on the support plate 612. The nozzle 613 has a circular pipe shape, and may supply a protection liquid to the center of the substrate W. Optionally, the nozzle 613 may have a length corresponding to the diameter of the substrate W, and the discharge hole of the nozzle 613 may be a slit. In this case, the support plate 612 may be provided in a fixed state. The protection liquid includes an expandable material. The protection liquid may be a material that has a low affinity for a photoresist and water. For example, the protection liquid may include a flourine-based solvent. The protective film applying unit 610 supplies a protection liquid to a central area of the substrate W while rotating the substrate W positioned on the support plate 612.

The baking unit 620 heat-treats the substrate W, to which the protective film is applied. The baking unit 620 has a cooling plate 621 and a heating plate 622. The cooling plate 621 is provided with a cooling unit 623 such as cooling water or a thermoelectric element. The heating plate 622 is provided with a heating unit 624 such as a heating wire or thermoelectric element. The heating plate 622 and the cooling plate 621 may be provided in one baking unit 620. Optionally, some of the baking units 620 may include only a heating plate 622, and some of the bake chambers 620 may include only a cooling plate 621.

The post-treatment module 602 has a cleaning chamber 660, a post-exposure baking unit 670, and a carrying chamber 680. The cleaning chamber 660, the carrying chamber 680, and the post-exposure baking unit 670 are sequentially disposed along the second direction 14. Accordingly, the cleaning chamber 660 and the post-exposure baking unit 670 are spaced apart from each other in the second direction 14 while the carrying chamber 680 is interposed therebetween. A plurality of cleaning chambers 660 may be provided, and the plurality of cleaning chambers 660 are disposed along the third direction 16 to form different layers. Optionally, a plurality of cleaning chambers 660 may be provided in each of the first direction 12 and the third direction 16. A plurality of post-exposure baking units 670 are provided, and the plurality of post-exposure bake chambers 610 are disposed along the third direction 16 to form different layers. Optionally, a plurality of post-exposure baking units 670 may be provided in each of the first direction 12 and the third direction 16.

When viewed from the top, the carrying chamber 680 is situated in parallel to the second cooling chamber 540 of the second buffer module 500 in the first direction 12. The carrying chamber 680 has a substantially square or rectangular shape. A post-treatment robot 682 is situated in the carrying chamber 680. The post-treatment robot 682 transports the substrate W between the cleaning chambers 660, the post-exposure baking units 670, the second cooling chamber 540 of the second buffer module 500, and a second buffer 730 of the interface module 700, which will be described below. The post-treatment robot 682 provided in the post-treatment module 602 may have the same structure as that of the pre-treatment robot 632 provided in the pre-treatment module 601.

The cleaning chamber 660 cleans the substrate W after the exposure process. The cleaning chamber 660 has a housing 661, a support plate 662, and a nozzle 663. The housing 661 has an open-topped cup shape. The support plate 662 is situated in the housing 661, and supports the substrate W. The support plate 662 may be provided to be rotatable. The nozzle 663 supplies a cleaning liquid onto the substrate W positioned on the support plate 662. The cleaning liquid may be water such as deionized water. The cleaning chamber 660 supplies a cleaning liquid to a central area of the substrate W while rotating the substrate W positioned on the support plate 662. Optionally, the nozzle 663 may be linearly moved or rotated from a central area to a peripheral area of the substrate W while the substrate W is rotated.

After the exposure process, the baking unit 670 heats the substrate W, on which the exposure process has been performed, by using a far infrared ray. After the exposure process, in the bake process, the substrate W is heated to finish a property change of the photoresist by amplifying acid produced in the photoresist through the exposure process. After the exposure process, the baking unit 670 has a heating plate 672. The heating plate 672 is provided with a heating unit 674 such as a heating wire or a thermoelectric element. After the exposure process, the baking unit 670 may be further provided with a cooling plate 671 in the interior thereof. The cooling plate 671 is provided with a cooling unit 673 such as a cooling water or a thermoelectric element. Optionally, a baking unit having only a cooling plate 671 may be further provided.

As described above, the pre/post-exposure module 600 is provided such that the pre-treatment module 601 and the post-treatment module 602 are completely separated from each other. The carrying chamber 630 of the pre-treatment module 601 and the carrying chamber 680 of the post-treatment module 602 may have the same size, and may completely overlap each other when viewed from the top. The protective film applying unit 610 and the cleaning chamber 660 may have the same size, and may completely overlap with each other when viewed from the top. The baking unit 620 and the post-exposure baking unit 670 may have the same size, and may completely overlap with each other when viewed from the top.

The interface module 700 feeds the substrate W between the pre/post-exposure module 600 and the exposure apparatus 900. The interface module 700 has a frame 710, a first buffer 720, a second buffer 730, and an interface robot 740. The first buffer 720, the second buffer 730, and the interface robot 740 are situated within the frame 710. The first buffer 720 and the second buffer 730 are spaced apart from each other by a predetermined distance, and may be stacked. The first buffer 720 is disposed at a location higher than the second buffer 730. The first buffer 720 is situated at a height corresponding to the pre-treatment module 601, and the second buffer 730 is disposed at a height corresponding to the post-treatment module 602. When viewed from the top, the first buffer 720 is disposed along the first direction 12 while forming a row with the carrying chamber 630 of the pre-treatment module 601, and the second buffer 730 is disposed along the first direction 12 forming a row with the carrying chamber 630 of the post-treatment module 602.

The interface robot 740 is situated to be spaced apart from the first buffer 720 and the second buffer 730 in the second direction 14. The interface robot 740 transports the substrate W between the first buffer 720, the second buffer 730, and the exposure apparatus 900. The interface robot 740 has a structure that is substantially similar to that of the second buffer robot 560.

The first buffer 720 temporarily preserves the substrates W, on which the pre-treatment module 601 has performed a process, before they are moved to the exposure apparatus 900. The second buffer 730 temporarily preserves the substrates W, on which the exposure apparatus 900 has completely performed a process, before they are moved to the post-treatment module 602. The first buffer 720 has a housing 721 and a plurality of supports 722. The supports 722 are disposed within the housing 721, and are spaced apart from one another along the third direction 16. One substrate W is positioned on each of the supports 722. The housing 721 has openings (not illustrated) on a side on which the interface robot 740 is provided and on a side on which the pre-treatment robot 721 is provided so that the interface robot 740 and the pre-treatment robot 632 carry a substrate W into the housing 721. The second buffer 730 has a structure that is substantially similar to that of the first buffer 720. Meanwhile, the housing 4531 of the second buffer 730 has openings (not illustrated) on a side on which the interface robot 740 is provided and on a side on which the post-treatment robot 682 is provided. The interface module may be provided only with buffers and a robot as described above while a chamber that performs a certain process on a substrate is not provided.

According to an embodiment of the inventive concept, a buffer space is provided between a central area of a support plate heated to a first temperature and a peripheral are heated to a second temperature. The buffer space may insulate and central area and the peripheral area of the substrate, thereby maximizing a temperature difference between the central area and the peripheral are.

According to an embodiment of the inventive concept, an influence of the second temperature on the central area heated to the first area may be minimized due to the buffer space. Accordingly, the area of the substrate corresponding to the central area may be uniformly heated.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate support apparatus comprising:
    a substrate support member including a support plate having an upper surface that supports a substrate;
    a heating member provided in the support plate to heat the substrate; and
    a buffer area, located in an area of the support plate, comprising a buffer space which restricts a heat transfer rate of heat provided from the heating member to the upper surface, wherein the buffer space is a chamber through which no fluid is circulated,
    wherein the buffer space is formed inside the support plate and is provided to be shielded from an outside.

2. The substrate support apparatus of claim 1, wherein the heating member heats a plurality of areas of the support plate to different temperatures, and
    wherein when viewed from the top, the buffer area and the heating member are located not to overlap each other.

3. The substrate support apparatus of claim 2, wherein the heating member includes:
    a first heater configured to heat a first area of the support plate to a first temperature; and
    a second heater configured to heat a second area of the support plate to a second temperature that is different from the first temperature, and
    wherein when viewed from the top, the buffer area is located between the first area and the second area.

4. The substrate support apparatus of claim 3, wherein the first area includes a central area of the support plate,
    wherein the second area includes a peripheral area of the support plate, and
    wherein when viewed from the top, the buffer area is provided to surround a circumference of the first area.

5. The substrate support apparatus of claim 4, wherein the buffer space includes:
   an inside space provided to surround the circumference of the first area; and
   an outside space that is independent from the inside space and provided to surround a circumference of the inside space.

6. The substrate support apparatus of claim 5, wherein the outside space has a depth that is larger than that of the inside space.

7. The substrate support apparatus of claim 4, wherein a vertical section of the buffer area has a circular shape of the buffer space.

8. The substrate support apparatus of claim 4, wherein a depth of the buffer space is constant.

9. The substrate support apparatus of claim 4, wherein a depth of the buffer space becomes larger as it goes away from a center of the support plate.

10. The substrate support apparatus of claim 1, wherein a difference value between a thickness (L1) connecting an upper surface and a bottom surface of the support plate and a depth (L2) of the buffer space is 1.5 mm or less.

11. The substrate support apparatus of claim 1, wherein the buffer space comprises an open volume disposed within the substrate support member.

12. The substrate support apparatus of claim 11, wherein the buffer space is spaced apart from the heating member in both a radial direction and a thickness direction of the substrate support member.

13. The substrate support apparatus of claim 11, wherein the open volume comprises at least a partial vacuum atmosphere.

\* \* \* \* \*